(12) United States Patent
Wang et al.

(10) Patent No.: US 11,757,473 B2
(45) Date of Patent: Sep. 12, 2023

(54) TELECOMMUNICATIONS METHOD

(71) Applicant: Airbus Defence and Space Limited, Stevenage (GB)

(72) Inventors: Jinfei Wang, Guildford (GB); Terence Dodgson, Stevenage (GB); Yi Ma, Guildford (GB); Songyan Xue, Guildford (GB)

(73) Assignee: Airbus Defence and Space Limited, Stevenage (GB)

( * ) Notice: Subject to any disclaimer, the term of this patent is extended or adjusted under 35 U.S.C. 154(b) by 0 days.

(21) Appl. No.: 17/430,808

(22) PCT Filed: Feb. 13, 2020

(86) PCT No.: PCT/GB2020/050339
§ 371 (c)(1),
(2) Date: Aug. 13, 2021

(87) PCT Pub. No.: WO2020/165593
PCT Pub. Date: Aug. 20, 2020

(65) Prior Publication Data
US 2022/0166540 A1    May 26, 2022

(30) Foreign Application Priority Data
Feb. 15, 2019    (GB) .................................. 1902114

(51) Int. Cl.
*H03M 13/45* (2006.01)
*H03M 13/23* (2006.01)
(Continued)

(52) U.S. Cl.
CPC ........ *H03M 13/451* (2013.01); *H03M 13/235* (2013.01); *H03M 13/3972* (2013.01); *H04L 1/0054* (2013.01); *H04L 1/0059* (2013.01)

(58) Field of Classification Search
CPC .................................................. H03M 13/451
See application file for complete search history.

(56) References Cited

U.S. PATENT DOCUMENTS

| 5,042,036 A | 8/1991 | Fettweis |
| 2005/0044474 A1 | 2/2005 | Zaboronski et al. |

(Continued)

OTHER PUBLICATIONS

Andrew James Ferris, Christoph Hirche and David Poulin; Convolutional Polar Codes; Apr. 3, 2017 (Year: 2017).*

(Continued)

*Primary Examiner* — Joseph D Torres
(74) *Attorney, Agent, or Firm* — Greer, Burns & Crain, Ltd.

(57) ABSTRACT

A method of telecommunications includes the steps of receiving an encoded block having a plurality of values, dividing the received encoded block into a plurality of received segments, each received segment comprising at least two of the values, decoding each received segment by providing, for each received segment, a plurality of estimated encoded sequences, each estimated encoded sequence comprising at least two data units, merging estimated encoded sequences for consecutive segments to provide a plurality of candidate sequences, and selecting one of the plurality of candidate sequences by performing a closest fit calculation between the received encoded data block and each of the candidate sequences. The method is suitable for use in software-defined radios.

9 Claims, 20 Drawing Sheets

(51) Int. Cl.
*H03M 13/39* (2006.01)
*H04L 1/00* (2006.01)

(56) References Cited

U.S. PATENT DOCUMENTS

| | | | |
|---|---|---|---|
| 2006/0062285 A1* | 3/2006 | Hong | H04L 27/2278 375/150 |
| 2011/0069791 A1 | 3/2011 | He | |
| 2014/0169388 A1* | 6/2014 | Jeong | H04L 1/0061 370/474 |
| 2017/0207863 A1* | 7/2017 | Shariat | H04J 11/0056 |
| 2017/0230141 A1 | 8/2017 | Jeong et al. | |
| 2020/0067639 A1* | 2/2020 | Lin | H04L 1/0061 |
| 2020/0259510 A1* | 8/2020 | Meller | H03M 13/13 |

OTHER PUBLICATIONS

Perry L. Blackburn; The Code Model of Communication—A Powerful Metaphor in Linguistic Metatheory; SIL e-Books; © 2007 SIL International; Library of Congress Catalog No. 2006-937183; ISBN-13: 978-1-55671-179-4; ISBN-10: 1-55671-179-4; ISSN: 1934-2470 (Year: 2007).*

Andrew James Ferris, Christoph Hirche, David Poulin; Convolutional Polar Codes; Cornell University; arXiv:1704.00715v1; Published Apr. 3, 2017 (Year: 2017).*

H-D Lin et al., "Algorithms and Architectures for Concurrent Viterbi Decoding" Department of Electrical Engineering and Computer Sciences, University of California, Berkeley, Jun. 11, 1989, pp. 836-840.

C. Su et al., "A Block-Based Parallel Decoding Architecture for Convolutional Codes" State Key Laboratory on Microwave and Digital Communications, Tsinghua National Laboratory for Information Science and Technology, Department of Electronic Engineering, Tsinghua University, Aug. 25, 2010, pp. 1-4.

J. Wang et al., "Parallel Decoding for Non-Recursive Convolutional Codes and Its Enhancement Through Artificial Neural Networks" 2019 IEEE 20th International Workshop on Signal Processing Advances in Wireless Communications (SPAWC), Jul. 2, 2019, pp. 1-5.

Communication from corresponding European application No. 20711247.5-1206 dated Apr. 21, 2023.

* cited by examiner

Initial data block: {1000101001010111} _/ 125

Output encoded data block: _/ 127
{11101100111000101111100010000110}

Converted encoded data block: {111-111-1-1111-1-1-11- _/ 131
111111-1-1-11-1-1-1-111-1}

Fig. 5

Received encoded data block: /133

Segments of received encoded data block:

Segment 1: {1.41, 0.34, 1.54, -0.80, 0.77, 1.40, -1.78, -1.59}

Segment 2: {1.45, 0.27, 1.29, 0.20, -0.83, -1.56, 1.44, -0.94}

Segment 3: {1.24, 0.52, 1.53, 1.48, 0.45, -1.76, -0.73, -1.00}

Segment 4: {1.75, -0.90, -1.15, -0.29, -1.25, 0.62, 0.24, -1.02}

Fig. 7

Segments of initial data block:

Segment 1: {v1, v2, v3, v4}   — 137a

Segment 2: {v5, v6, v7, v8}   — 137b

Segment 3: {v9, v10, v11, v12}   — 137c

Segment 4: {v13, v14, v15, v16}   — 137d

Fig. 8

| Col. D1 | Col. E1 | Col. D2 | Col. E2 | Col. D3 | Col. E3 | Col. D4 | Col. E4 |
|---|---|---|---|---|---|---|---|
| 00 | 0000 | 01 | 0000 | 10 | 0000 | 11 | 0000 |
| 00 | 0001 | 01 | 0001 | 10 | 0001 | 11 | 0001 |
| 00 | 0010 | 01 | 0010 | 10 | 0010 | 11 | 0010 |
| 00 | 0011 | 01 | 0011 | 10 | 0011 | 11 | 0011 |
| 00 | 0100 | 01 | 0100 | 10 | 0100 | 11 | 0100 |
| 00 | 0101 | 01 | 0101 | 10 | 0101 | 11 | 0101 |
| 00 | 0110 | 01 | 0110 | 10 | 0110 | 11 | 0110 |
| 00 | 0111 | 01 | 0111 | 10 | 0111 | 11 | 0111 |
| 00 | 1000 | 01 | 1000 | 10 | 1000 | 11 | 1000 |
| 00 | 1001 | 01 | 1001 | 10 | 1001 | 11 | 1001 |
| 00 | 1010 | 01 | 1010 | 10 | 1010 | 11 | 1010 |
| 00 | 1011 | 01 | 1011 | 10 | 1011 | 11 | 1011 |
| 00 | 1100 | 01 | 1100 | 10 | 1100 | 11 | 1100 |
| 00 | 1101 | 01 | 1101 | 10 | 1101 | 11 | 1101 |
| 00 | 1110 | 01 | 1110 | 10 | 1110 | 11 | 1110 |
| 00 | 1111 | 01 | 1111 | 10 | 1111 | 11 | 1111 |

TELECOMMUNICATIONS METHOD

CROSS-REFERENCES TO RELATED APPLICATIONS

This application claims the benefit of the International Application No. PCT/GB2020/050339, filed on Feb. 13, 2020, and of the Great Britain patent application No. 1902114.6 filed on Feb. 15, 2019, the entire disclosures of which are incorporated herein by way of reference.

FIELD OF THE INVENTION

The present invention concerns a telecommunications method. In particular, but not exclusively, the invention concerns such a method for reducing errors in telecommunications, for example for use in software-defined radios.

BACKGROUND OF THE INVENTION

Software-defined radios are capable of receiving and transmitting a wide variety of different waveforms (i.e., radio protocols), since they may be programmed to operate in a number of different configurations according to the particular functions required. The versatile functionality provided by software-defined radios is useful in a number of applications, including in military operations encompassing numerous communications schemes, and in mobile phone communications where there are frequent upgrades. Ideally, software-defined radio systems would be capable of processing any type of waveform through simply adapting the software.

There is a desire to use channel coding (also known as forward-error correction) techniques in software-defined radio communications to reduce errors in transmission. Channel coding may be particularly useful in situations where communication channels are unreliable or noisy, and/or where re-transmission would be expensive or impractical. Channel coding typically uses an error-correction code (ECC) to encode the data to be transmitted. During encoding, redundant data is introduced which enables the receiver to correct errors so that re-transmission of data is not required. This is at the expense of higher forward channel bandwidth. A common type of error-correction code is a convolutional code. Typically, in the prior art, a Viterbi algorithm is used to decode convolutional codes.

Viterbi decoding is a form of soft decoding which determines the most likely path (the "Viterbi path") to the observed output; however, Viterbi decoding is relatively slow, consumes significant memory, and has not to date provided the desired flexibility in processing different waveform types. An improved decoding scheme for convolutionally encoded data is required.

SUMMARY OF THE INVENTION

In a first aspect, the invention provides a method of telecommunications, the method comprising the following steps: receiving an encoded data block having a plurality of values; dividing the received encoded data block into a plurality of received segments, each received segment comprising at least two of the values; decoding each received segment by providing, for each received segment, a plurality of estimated encoded sequences, each estimated encoded sequence comprising at least two data units; merging estimated encoded sequences for consecutive segments to provide a plurality of candidate sequences; selecting one of the plurality of candidate sequences by performing a closest fit calculation between the received encoded data block and each of the candidate sequences.

The hierarchy of channel codecs may be divided into three groups: block codecs, simple convolutional codecs and complex, multi coder, convolutional codecs. The present invention relates to codecs which fall into the second category of simple convolutional codecs.

The method may be a computer-implemented method. For example, the method may be undertaken on a processor of a software-defined radio. Receiving may comprise receiving on an antenna. Receiving may comprise receiving through a wired connection. There may be tens of values. There may be hundreds of values. There may be thousands, hundreds of thousands, or more than a million values. The received encoded data block may contain errors. The number of received segments may be selected to be a power of two. Providing, for each received segment, a plurality of estimated encoded sequences may comprise calculating, for each received segment, a plurality of estimated encoded sequences. There may be more than one way of undertaking the calculating, for example, by generating look-up tables or by using a neural network. The data units may comprise bits, for example binary bits having value 0 or 1. Merging may comprise joining end-to-end. The closest-fit calculation may include minimization of a metric, for example Euclidian distance.

The inventors have recognized that, by dividing the received data block into segments, the received segments may be decoded simultaneously, in parallel, thus providing a considerable increase in processing speed over decoding methods of the prior art. The decoded segments may also be merged in parallel providing a further reduction in latency.

In a further advantage, the inventors have recognized that segmenting the received data block provides for the possibility of processing with an artificial neural network, which has not previously been realizable due to incompatibility between Viterbi decoding schemes and artificial neural networks.

For example, the step of decoding each received segment by providing, for each received segment, a plurality of estimated encoded sequences may be undertaken using an artificial neural network. Training may be provided, for example, by supplying the neural network with noisy received segments together with the coder configuration and the known corresponding input bit sequences. After sufficient training, the neural network should then be able to correctly identify for each received segment, the most likely input bit combination and corresponding estimated encoded data sequence. A typical (but not necessarily exclusive) architecture for the artificial neural network could be an Adaptive Neural Network based on the Multi Layer Perceptron architecture which uses forward propagation to generate outputs that are then refined using back propagation through the network. Back propagation would typically involve a Stochastic Gradient Descent process, followed by an Adams optimization process.

Using an artificial neural network in this manner may significantly increase processing speed (i.e., latency) compared to decoding techniques of the prior art. For example, the processing speed may be of the order of 20 times, or more, faster.

In a further advantage, the method of the invention lends itself to codec update, and may be more readily deployed in a software-defined radio than decoding schemes of the prior art. When deployed in a software-defined radio, use of an artificial neural network to perform the present invention may enable easy adaptation to multiple different waveforms, through updating of the neural network weights.

When the present invention is deployed in a software-defined radio, the radio may be more easily, cheaply and quickly adapted to individual user needs or altered remedially in response to external events. The present technique provides a radical improvement in the ease and speed of tailoring and remedial alteration.

The step of providing a plurality of estimated encoded data sequences may comprise providing, for each received segment, a plurality of estimated input sequence segments, each estimated input sequence segment comprising at least two data units, and calculating the plurality of estimated encoded data sequences by applying a coding model to the plurality of estimated input sequence segments.

The coding model may be a convolutional coder, for example a simple convolutional coder. The convolutional coder may comprise a shift register with length three and two summations arms. Other convolutional coders fall within the scope of the invention, for example having a different length of shift register, a different number of summation arms and/or a different number of tap-off points.

Decoding each received segment may comprise decoding each received segment in parallel. Decoding in parallel may be undertaken for example through a method involving generation of look-up tables or through use of a neural network.

Decoding each received segment may alternatively comprise decoding each received segment in series.

Providing, for each received segment, a plurality of estimated encoded sequences, may comprise for each received segment, performing a closest fit calculation. The closest fit calculation may be between the estimated encoded sequences or sequences related to the estimated encoded sequences (for example, converted from the estimated encoded sequences), and the received segment.

The closest fit calculation may include a minimization of a metric, for example, a Euclidian distance.

Merging may comprise for each received segment in turn: merging estimated encoded sequences for the received segment with estimated encoded sequences for a consecutive received segment to provide a plurality of merged sequences, and then performing a closest fit calculation between the merged sequences and the corresponding received segments combined, and then merging the merged sequences with estimated encoded sequences for a further subsequent received segment, until a plurality of candidate sequences is provided each having a length equal to the length of the received encoded data block. The closest fit calculation may include a minimization of a metric, for example, a Euclidian distance.

At least some of the steps of the method may be performed using an artificial neural network. For example, the step of decoding each received segment by providing, for each received segment, a plurality of estimated encoded sequences, each estimated encoded sequence comprising at least two data units, may be performed using an artificial neural network. Use of an artificial neural network may provide a considerable increase in processing speed.

Merging may comprise: for each estimated encoded data sequence: (i) identifying an initial residual data unit combination representing the data units that would be residual in a coder memory when the first data unit of the corresponding estimated input sequence segment enters the coder, and (ii) identifying a final residual bit combination representing the data units that would be residual in the coder memory when the first data unit of the subsequent estimated input sequence segment enters the coder, and (iii) matching the final residual bit combinations corresponding to the estimated encoded data sequences for one received segment, to the initial residual bit combinations corresponding to the estimated encoded data sequences for the subsequent received segment.

The method may further comprise the steps of: encoding a data block having a plurality of bits, using a convolutional coder to provide the encoded data block; and transmitting the encoded data block.

In a second aspect, the invention provides a computer program configured to execute the steps of the method of the first aspect.

In a third aspect, the invention provides a software-defined radio comprising: an antenna; an analogue to digital converter; a processor; a memory; wherein the processor is configured to run the computer program of the third aspect.

BRIEF DESCRIPTION OF THE DRAWINGS

An embodiment of the invention will now be described by way of example only with reference to the accompanying schematic drawings of which:

FIG. 5 shows an initial data block, output encoded data block and converted encoded data block in accordance with the coder of FIG. 3;

FIG. 6 shows a received encoded data block in accordance with the coder of FIG. 3;

FIG. 7 shows segments of the received encoded data block of FIG. 6;

FIG. 8 shows segments of the initial data block of FIG. 5;

FIG. 13 shows the possible "starting residual bits" and possible segment bit combinations for the second received segment;

DETAILED DESCRIPTION OF THE PREFERRED EMBODIMENTS

Figure 1:
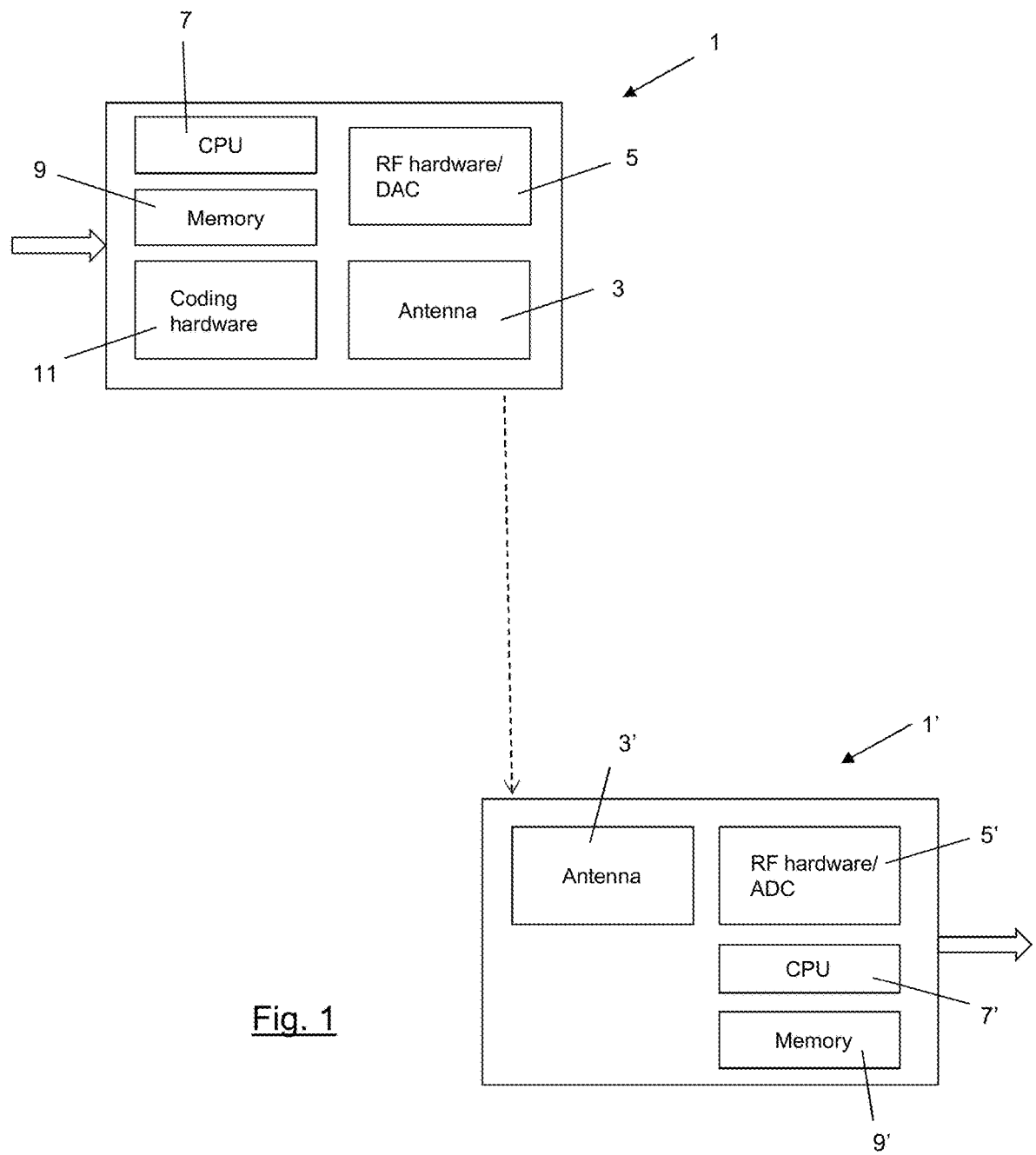
FIG. 1 is a schematic diagram of a software-defined radio in accordance with the example embodiment of the invention.

In general, and as is known in the prior art, a software-defined radio 1, 1' (FIG. 1) for transmitting and receiving encoded data will comprise an antenna 3, 3', radio frequency front-end hardware 5, 5' including analogue-to-digital and digital-to-analogue converters, a central processing unit 7, 7' and memory 9, 9'. A software-defined radio 1 for transmitting signals could be configured differently to a software-defined radio 1' for receiving signals; however, in the example embodiment of the invention, the software-defined radio 1, 1' is configured as a transceiver, containing both transmitter and receiver parts. For ease of illustration, a transmitting 1 and a receiving 1' radio are shown separately with only the relevant transmitting or receiving functional components shown and the others omitted. In the example embodiment of the invention, the radio 1, 1' also comprises coding hardware 11 in the form of a coder circuit, although in another example embodiment, the coding could be undertaken in software. In the example embodiment of the invention, decoding is undertaken in software, running on the central processing unit 7'. In the example embodiment of the invention, the radio is a hand-held radio, but could alternatively be a personal computer or other form of radio.

Figure 2:
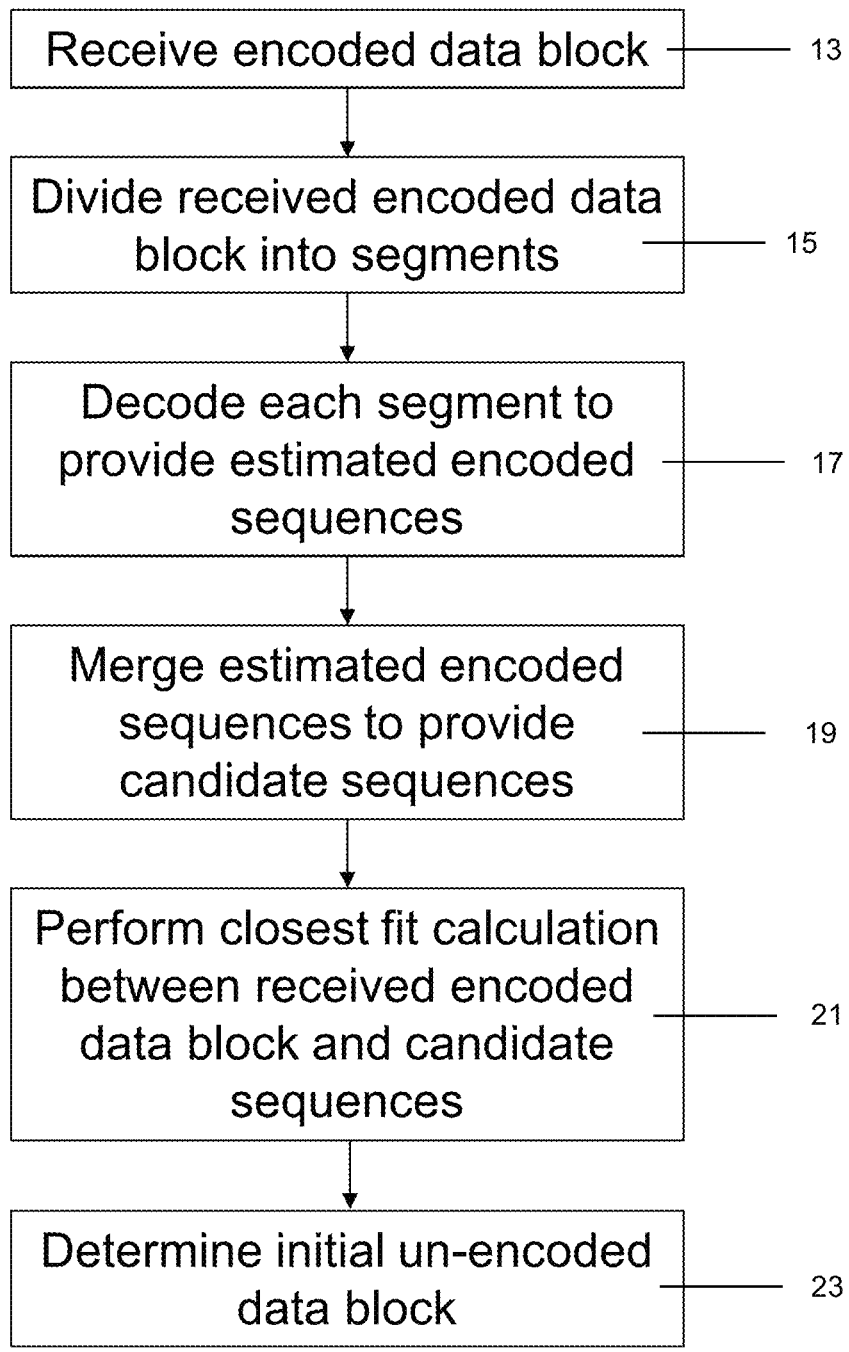
FIG. 2 is a flow diagram of the steps of the method of the example embodiment of the invention.

A telecommunications method for decoding a received encoded data block in an example embodiment of the invention comprises five main steps (FIG. 2). In a first step 13, the encoded data block is received by the antenna 3'. The received signal is then processed (for example, amplified) as is known in the art by the radio-frequency front-end hardware 5', and sampled by the analogue-to-digital converter (step not shown). There may be a further step of processing the digital signal using software applications running on the central processing unit 7', as is also known in the art. In steps two to six, the digitized received signal is decoded by the central processing unit 7', running software applications and accessing the memory 9'. In a second step 15, the received encoded data block is divided into a plurality of segments. In a third step 17, each segment is decoded so as to provide a plurality of estimated encoded sequences. In a fourth step 19, the estimated encoded sequences are merged to provide candidate sequences. In a fifth step 21, a closest-fit calculation is performed between the received encoded data block and the candidate sequences. The candidate sequence which is the closest-fit is then taken to be the transmitted data sequence. In a sixth step 23, the initial un-encoded data block is then determined, since there is a known correspondence between the estimated encoded sequences and the bits of the initial un-encoded data block (i.e., the coder model is known). In the example embodiment of the invention, the data block has been encoded using a convolutional coder circuit 101 which forms part of coding hardware 11.

Simple convolutional coders (i.e., using only one shift register) may be characterized by three items: (i) the constraint length, (ii) the coding rate (ratio of input to output bits of the coder, which is often the ratio of the input data rate to output data rate) and (iii) each of the output coder arm's modulo-2 summation connections to the shift register (for example, expressed in polynomial or octal form).

Figure 3:
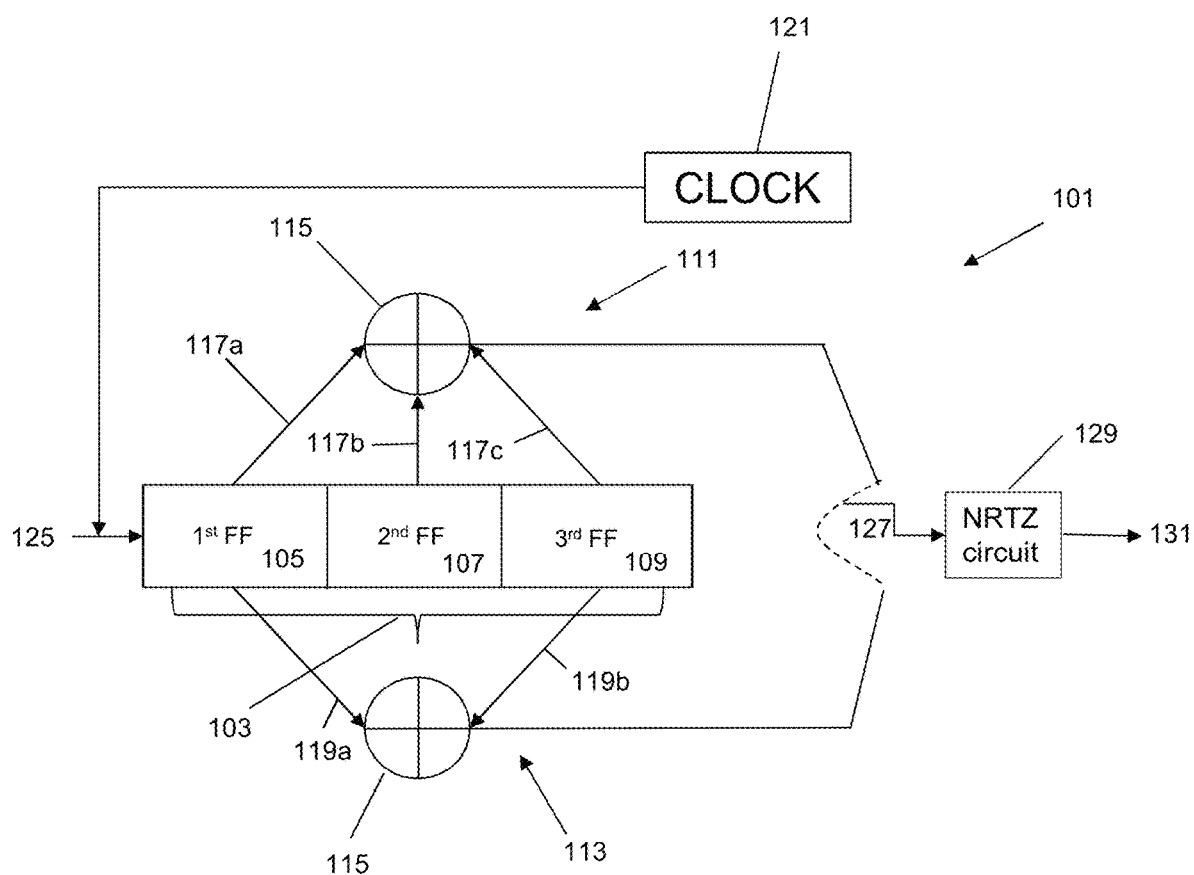
FIG. 3 is a schematic diagram of a convolutional coder in accordance with the example embodiment of the invention.

In the example embodiment of the invention, a simple convolutional coder 101 with two binary summation arms has coding rate ½ and shift register length three (i.e., three memory registers) (FIG. 3).

The coder 101 has a shift register 103 comprising first 105, second 107 and third 109 flip-flops, and has two summation arms: an upper summation arm 111 and a lower summation arm 113. Ingoing bits are shifted sequentially through the first flip-flop 105, through the second flip-flop 107, through the third flip-flop 109 and out of the shift register 103. Since the coding rate of a convolutional coder is known to be n/k, the coder 101 of the example embodiment of the invention has a coding rate equal to 1/2. For every one bit that enters the coder 101, two encoded bits are output. Since the constraint length of a convolutional coder is known to be n(K−1), the coder 101 of the example embodiment of the invention has constraint length equal to two, that is, the number of bits in the coder memory affecting generation of each two output bits is two.

Figure 4:
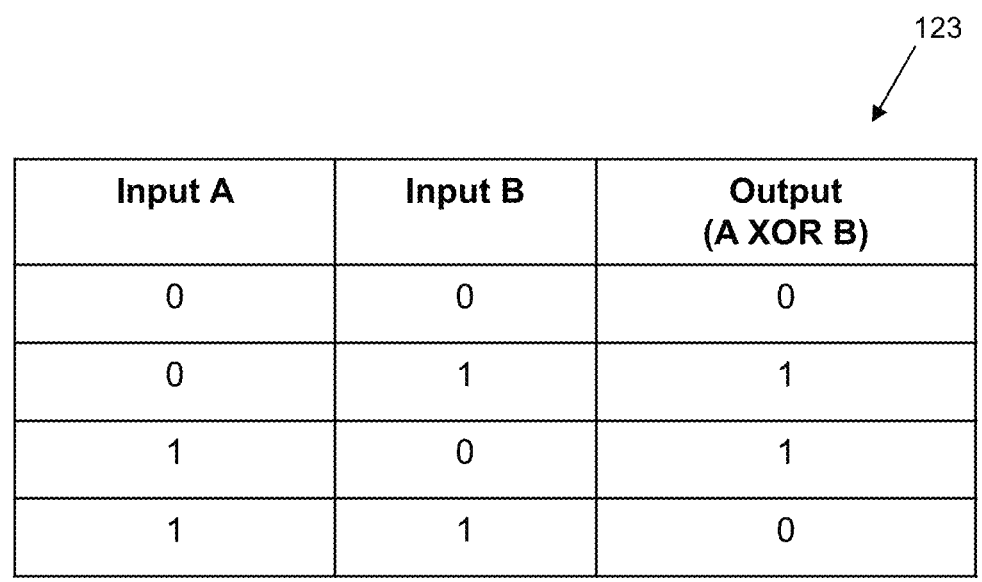
FIG. 4 is a logic table in accordance with the coder of FIG. 3.

Each summation arm 111, 113 comprises a modulo-two adder 115 having an exclusive OR (XOR) gate. The upper summation arm 111 draws data from three tap-off points 117a, 117b, 117c and performs a modulo-two summing calculation using a standard XOR gate logic table 123 (FIG. 4). The lower summation arm 113 draws data from two tap-off points 119a, 119b (returning to FIG. 3) and performs a modulo-two summing calculation using the same logic table 123.

Ingoing bits having value 0 or 1 are fed into the coder 101 according to a clock 121. On each increment of the clock 121: the first tap-off point 117a of the upper summation arm 111 reads the value of the first flip-flop 105 (i.e., it reads the value of the bit input to the first flip-flop 105); and at the same time the second tap-off point 117b of the upper summation arm 111 reads the value of the second flip-flop 107 (i.e., it reads the value of the bit output from the first flip-flop 105 and input to the second flip-flop 107); and at the same time the third tap-off point 117c of the upper summation arm 111 reads the value of the third flip-flop 109 (i.e., it reads the value of the bit output from the second flip-flop 107 and input to the third flip-flop 109). The modulo-two adder 115 of the upper summation arm 111 sums the three read-out values. As a person skilled in the art will appreciate, in such modulo-two summation of three read-out values, the bit values output from the first 105 and second 107 flip-flops are summed first, and the resultant bit of that summation is summed with the value output from the third flip-flop 109, to provide an upper output bit having value 0 or 1. Upon each increment of the clock 121, the upper output bit is output by the upper summation arm 111.

At the same time, on each increment of the clock 121: the first tap-off point 119a of the lower summation arm 113 reads the value of the first flip-flop 105; and the second tap-off point 119b of the lower summation arm 113 reads the value of the third flip-flop 109. The modulo-two adder 115 of the lower summation arm 113 sums the two read-out values. The values output from the first 105 and third 109 flip-flops are summed to provide a lower output bit having value 0 or 1. Upon each increment of the clock 121, the lower output bit value is output by the lower summation arm 113.

As is known in convolutional coders of the prior art, the upper output bits and lower output bits are output from the coder 101 alternately, with each bit output from the upper summation arm 111 read out first and each bit output from the lower summation arm 113 read out second (in an alternative embodiment, the order may be reversed).

In the example embodiment of the invention, an initial data block 125 has 16 bits each having value 0 or 1 (FIG. 5). When encoded, the corresponding output, encoded, data block 127 has twice as many bits as the initial data block 125 (i.e., 32 bits). In the example embodiment of the invention, the output, encoded, data block 127 is directed through a "None Return to Zero" circuit 129, which modulates the bit stream in a standard way, to convert it to "None Return to Zero" format. The "None Return to Zero" circuit 129 outputs a converted, encoded, data block 131 comprising 32 values equal to 1 or −1. In an alternative embodiment, there may be no conversion to "None Return to Zero" format, or conversion to an alternative format.

Figure 6:
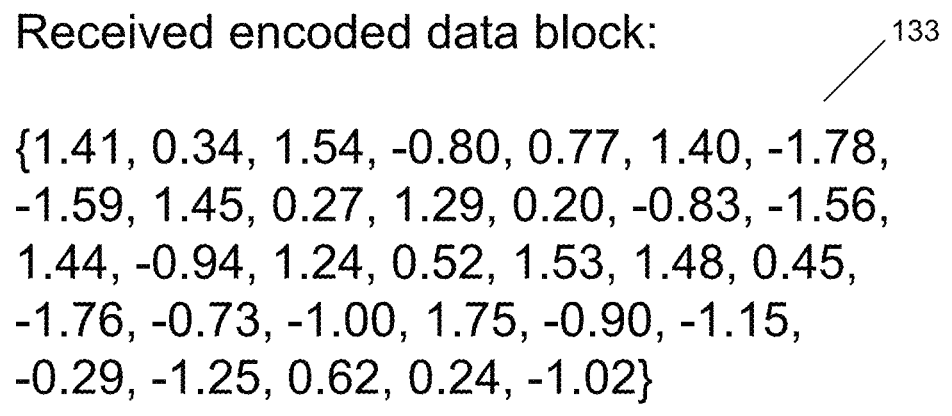

The converted, encoded, data block 131 is then transmitted in a noisy channel, and received by a receiver (not shown). Due to the noise, the received, encoded, data block values 133 (FIG. 6) do not match precisely the values prior to transmission (i.e., the converted, encoded, data block values 131). The received, encoded, data block values 131 must be decoded to determine the initial data block values 125.

In the example embodiment of the invention, a method of decoding the received, encoded, data block values 133 to determine the initial data block values 125 comprises five steps:

Step 1—Segment Formation

In the first step of the method, the received, encoded, data block is divided into a number of segments 135a, 135b, 135c, 135d for decoding (FIG. 7).

For ease of illustration, in the example embodiment of the invention, the number of values in the received, encoded, data block 133 has been chosen to be a power of two (i.e., 32=25). In other example embodiments of the invention, there may be many more bits in the received, encoded, data block, for example, of the order of 100,000 or 1,000,000 bits.

Also for ease of illustration, in the example embodiment of the invention, the number of segments in the received, encoded, data block 133 has been chosen to be a power of two and related to the square root of the received, encoded, data block size by the following formula:

$$N_{segments} = 2^{FLOOR\left(\frac{log_{10}(\sqrt{N_y})}{log_{10}(2)}\right)}$$

FLOOR: Rounding the value in parentheses down to the nearest integer $N_y$: the number of values in the received, encoded, data block 133

Thus, in the example embodiment of the invention, where $N_y$=32:

$N_{segments}$=4

Accordingly, the received, encoded data block 133 is split into four received segments 135a, 135b, 135c, 135d, each containing eight values. In an alternative embodiment of the invention, the number of values in the received, encoded, data block 133 may be a number that is not a power of two, and indeed, the number of segments may be a number that is not a power of two. For example, the received, encoded, data block 133 could feasibly contain 18 values and be split into three segments of six values. In that case, the initial data block of 9 bits could for example, be split into three segments of three bits.

Once the number of segments is determined, the initial data block 125 may also be represented in the same number of segments, but with the segments being half the size of the received segments 135a, 135b, 135c, 135d (i.e., the segments of the received, encoded, data block 133). Since the coding rate is known and the size of the received, encoded, data block 133 is known, it is also known that the initial data block 125 must contain 16 bits. Thus for ease of illustration, in the example embodiment of the invention, the initial data block 125 is taken to contain four initial segments 137a, 137b, 137c, 137d each containing four values, wherein those values are to be determined (FIG. 8).

Step 2—Segment Decoding

Each received segment 135a, 135b, 135c, 135d is decoded in parallel (in another example embodiment, each received segment is decoded in series). In the example embodiment of the invention, the decoding uses "maximum likelihood" decoding to determine, for each received segment 135a, 135b, 135c, 135d, a set of estimated encoded sequences containing the most likely values for the corresponding initial segment 137a, 137b, 137c, 137d (i.e., each segment of the initial data block 125). While "maximum likelihood" decoding per se is known, its implementation in the present method of the invention has not previously been recognized.

To perform the "maximum likelihood" decoding, look-up tables are constructed for each received segment 135a, 135b, 135c, 135d.

Figure 9:
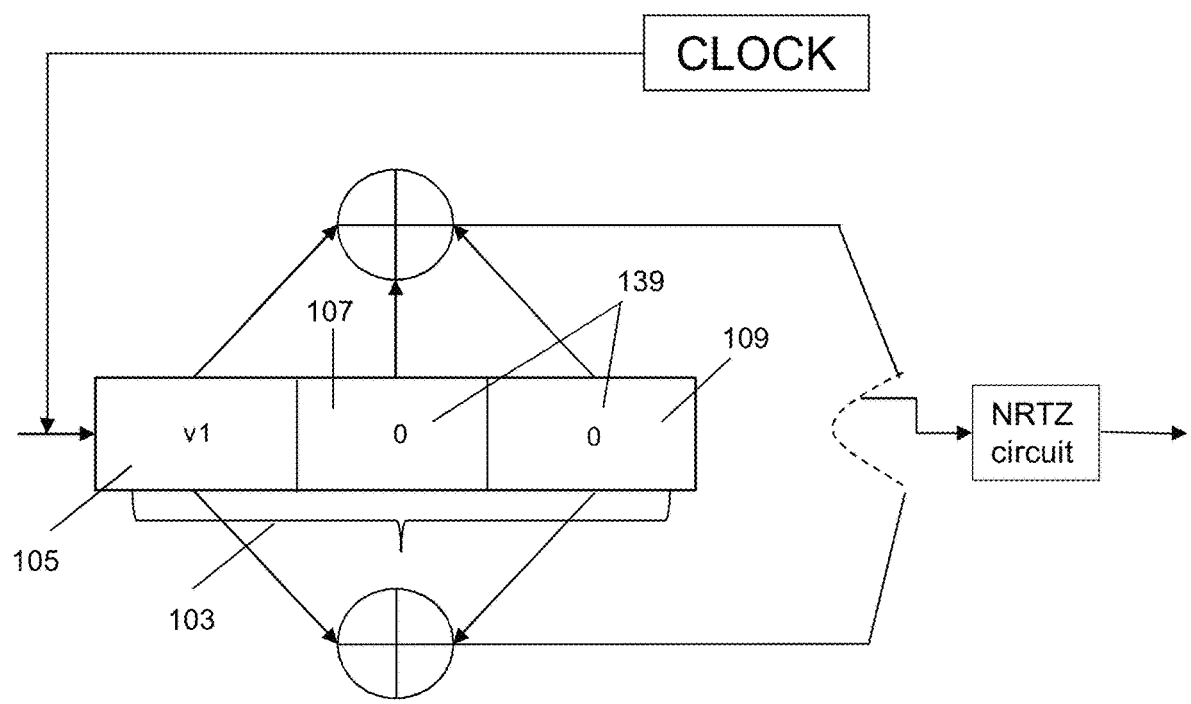
FIG. 9 is a schematic diagram of the convolutional coder of FIG. 3, at start of processing time.

First, look-up tables are constructed for the first received segment 135a. For the first received segment 135a, it is assumed that the coder shift register 103 is initialized to zero at the start of processing (t=0). Therefore, it is assumed that when the first bit v1 of the first initial segment 137a enters the coder shift register 103 (i.e., input to the first flip-flop 105), the residual bits in the shift register 103 (i.e., the values of the second 107 and third 109 flip-flops) have values equal to zero (FIG. 9). The residual bits in the shift register 103 at the start of processing i.e., when the first bit v1 of the first initial segment 137a enters the shift register 103, are herein termed the "starting residual bits" 139 for the first initial segment 137a. (Similarly, the residual values (not shown) in the shift register 103 when the first bit v5 of the second initial segment 137b enters the shift register 103 are the "starting residual bits" for the second initial segment 137b, and so on). In other words, it is assumed that upon the first clock increment, when the first bit v1 of the first initial segment 137a enters the first flip-flop 105 of the shift register 103 and simultaneously the upper summation arm 111 performs the first summation, the value read out from the second flip-flop 107 is zero and the value read out from the third flip-flop 109 is zero. The value read out from the first flip-flop 105 is to be determined.

Figure 10:
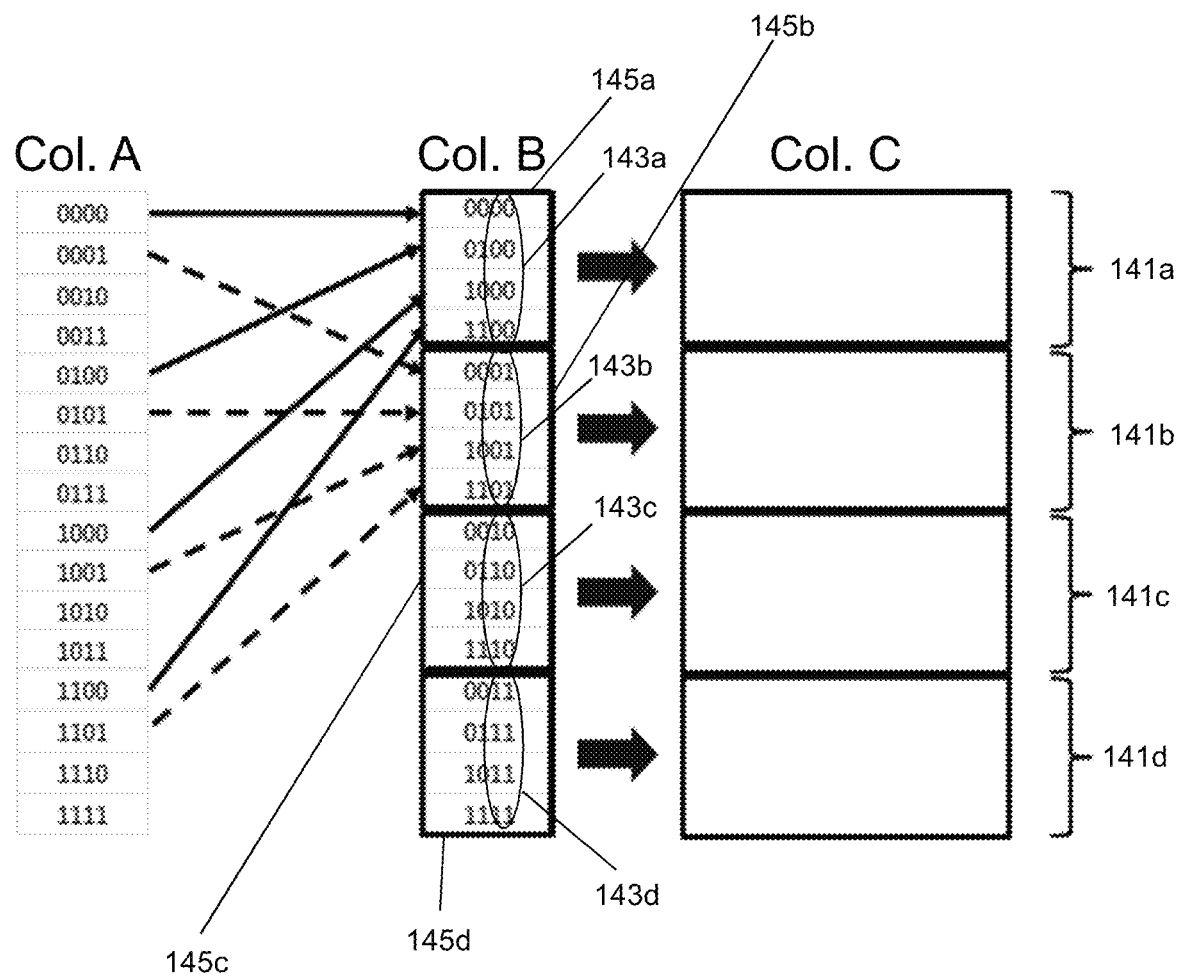
FIG. 10 is a flow diagram showing the construction of look-up tables for the first received segment of FIG. 7.

For the first received segment 135a, four look-up tables 141a, 141b, 141c, 141d are constructed (FIG. 10, Column C). To construct the look-up tables, first, each possible bit combination (Column A) for the first initial segment 137a is listed. The first initial segment has a possible bit combinations, where λ is the number of bits in the segment. In the example embodiment of the invention, λ=4, giving 16 possible input bit combinations.

Figure 11:
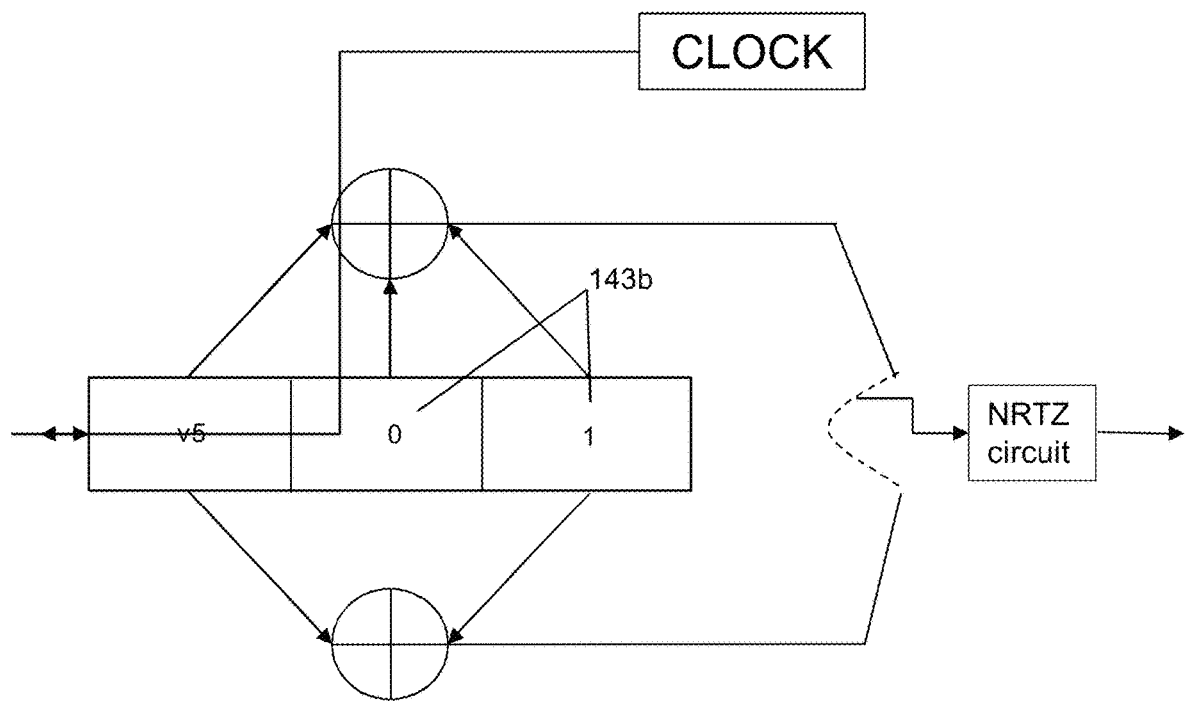
FIG. 11 is a schematic diagram of the coder of FIG. 3, when the first bit of the second initial segment enters the shift register.

The 16 possible input bit combinations are then re-organized into four groups of four (Column B). The grouping is made according to the bits which would be residual in the shift register 103 when the first bit v5 of the second initial segment 137b enters the shift register 103. The options for the bits which could be residual in the shift register 103 when the first bit v5 of the second initial segment 137b enters the shift register 103 are: [0 0], [0 1], [1 0], [1 1]. These bit pairs are herein termed respectively the "final residual bits" 143a, 143b, 143c, 143d for the first initial segment 137a (FIG. 11, which depicts by way of example, the shift register 103 having "final residual bits" for the first initial segment 137a of [0 1] 143b). Thus, in the first grouping 145a, the last two digits of each of the four possible input bit combinations is [0 0] (returning to FIG. 10). In the second grouping 145b, the last two digits of each of the four possible input bit combinations is [0 1]. In the third grouping 145c, the last two digits of each of the four possible input bit combinations is [1 0]. In the fourth grouping 145d, the last two digits of each of the four possible input bit combinations is [1 1].

From the four groupings 145a, 145b, 145c, 145d the four look-up tables 141a, 141b, 141c, 141d (Column C) are constructed, each look-up table containing the coder output values in "None Return to Zero" format which would be output for each of the possible input bit combinations (Column B). The coder output bits can be determined since the coder model is known (or at least assumed) to be a convolutional coder [1, 2, 3]. Thus, in each look-up table 141a, 141b, 141c, 141d for the first initial segment 137a, there are four possible output sequences, each having eight values (wherein each value is 1 or −1).

Figure 12:
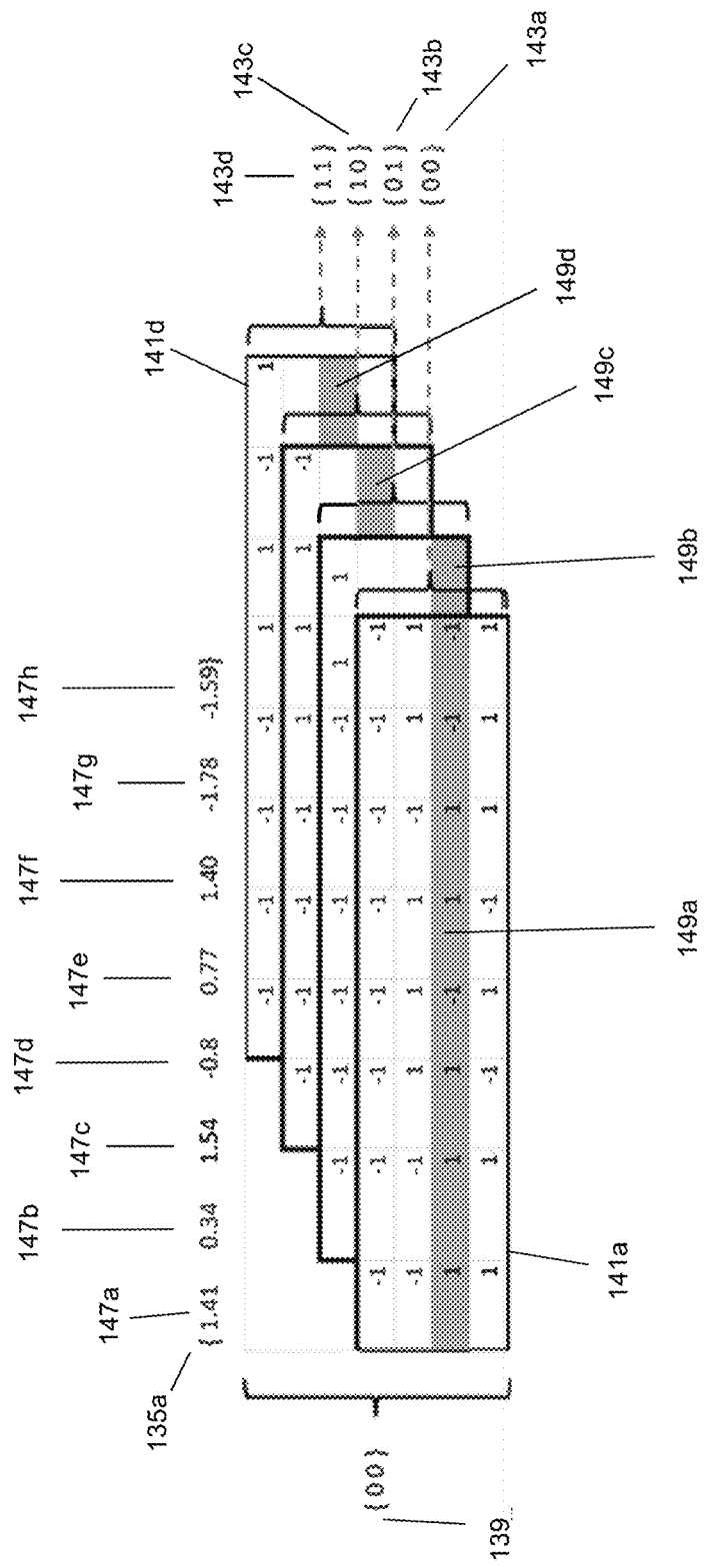
FIG. 12 shows the look-up tables for the first received segment.

Once the look-up tables 141a, 141b, 141c, 141d for the first initial segment 137a have been constructed, the first received segment 135a (which contains eight received data values 147a-147h) may be decoded. The first received segment 135a is compared against the four possible output sequences in each look-up table 141a, 141b, 141c, 141d, to obtain a closest match 149a, 149b, 149c, 149d for each look-up table (FIG. 12). The closest match is determined by calculating whether each received data value 147a-147h is closer to 1 or closer to −1 in a Euclidian sense, and then highlighting the corresponding cells in the appropriate column of each look-up table. The closest match for each look-up table is determined by selecting the row in each look-up table with the highest number of highlighted cells. If there are no errors in transmission, then it would be expected that every cell in a single row should be highlighted. The more error that is introduced in transmission, the more the received values will deviate from their original 1 or −1 values, and therefore the more mis-matches there will be in the row with the highest number of highlighted cells. Introducing redundant cells helps to mitigate the risk of mis-identifying a closest match in the event of noisy transmission, since the ratio of mis-matches to matches will be smaller.

The four estimated encoded sequences (i.e., the closest matches) 149a, 149b, 149c, 149d for each look-up table 141a, 141b, 141c, 141d are stored in the memory 9 for later use, together with the corresponding first initial segment bit combinations (FIG. 10, Column B), the "starting residual bits" 139 (which for the first input segment are [0 0] for each estimated encoded sequence) and the associated "final residual bits" 143a, 143b, 143c, 143d (either [0 0], [0 1], [1 0] or [1 1], depending on the look-up table).

Next, look-up tables are constructed for the second initial segment 137b. The second initial segment 137b also has four bits, and therefore also has 16 possible input bit combinations (FIG. 13, Columns E1, E2, E3 and E4). However, in contrast to the first initial segment 137a, for the second initial segment 137b, there are four possible "starting residual bits" combinations: [0 0], [0 1], [1 0] and [1 1] (Columns D1, D2, D3 and D4) which correspond to the four "final residual bits" combinations 143a, 143b, 143c and 143d of the first initial segment 137a. A set of four look-up tables are constructed for each "starting residual bits" combination, giving a total of 16 look-up tables.

The look-up tables for the second initial segment 137b are constructed as described above in relation to the first initial segment 137a, by repeating the methodology for each "starting residual bits" combination (Columns D1, D2, D3 and D4).

Figure 14:
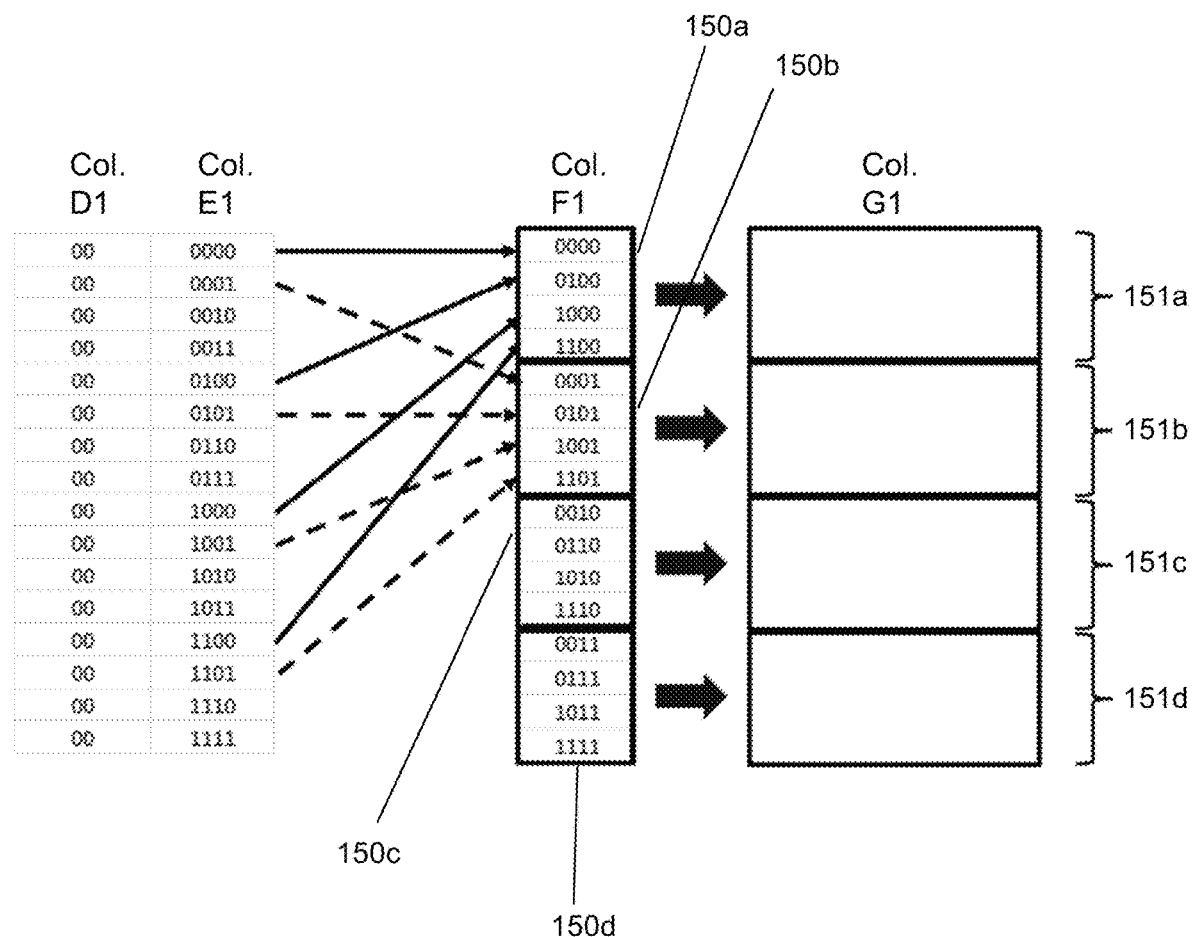
FIGS. 14-17 are flow diagrams showing the construction of look-up tables for the second received segment.

For the first starting residual bits combination [0 0] (FIG. 14, Column D1), the possible bit combinations for the second initial segment 137b (Column E1) are re-arranged in four groups of four 150a, 150b, 150c, 150d (Column F1) and then corresponding look-up tables 151a, 151b, 151c, 151d (Column G1) are constructed by applying the coder model to each of the possible bit combinations (Column F1).

Figure 15:
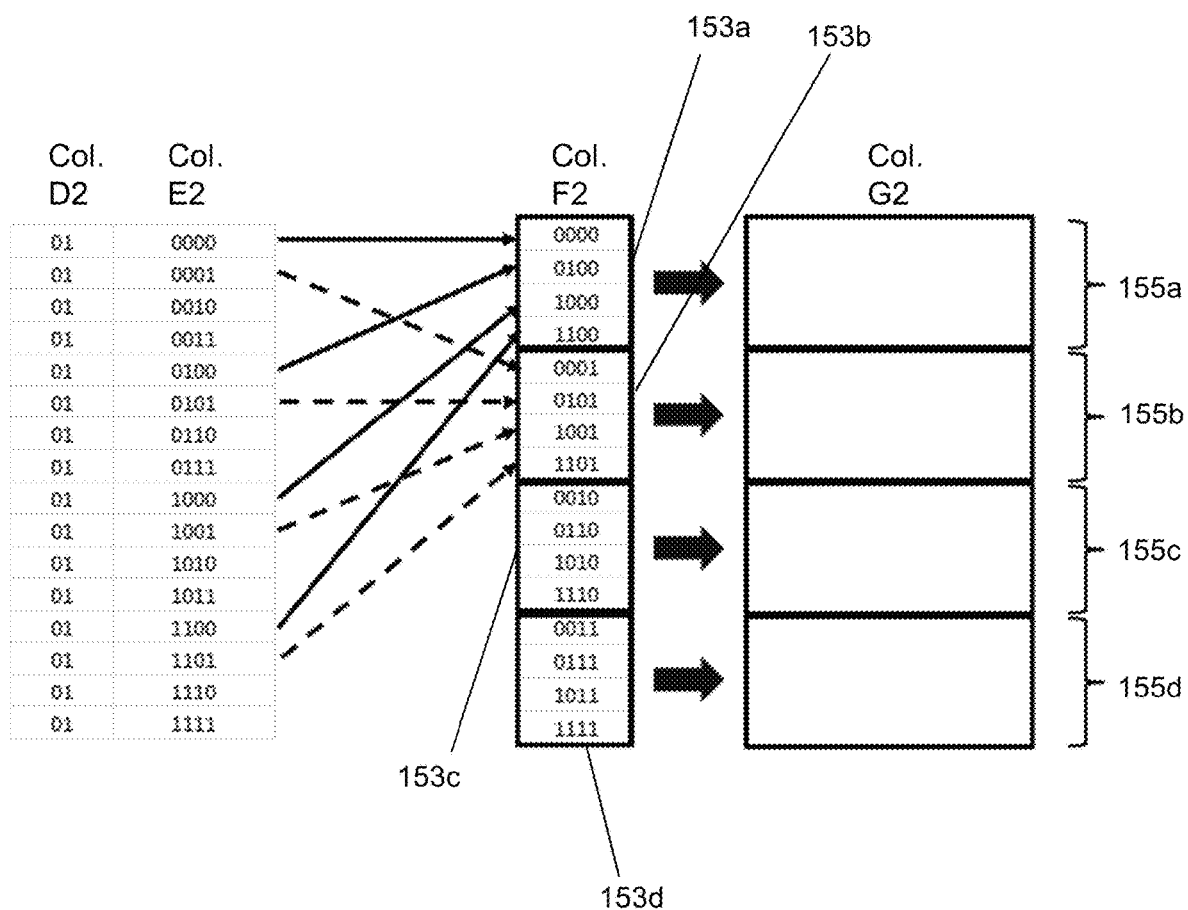

Similarly, for the second starting residual bits combination [0 1] (FIG. 15, Column D2), the possible bit combinations for the second initial segment 137b (Column E2) are re-arranged in four groups of four 153a, 153b, 153c, 153d (Column F2) and then corresponding look-up tables 155a, 155b, 155c, 155d (Column G2) are constructed by applying the coder model to each of the possible bit combinations (Column F2).

Figure 16:
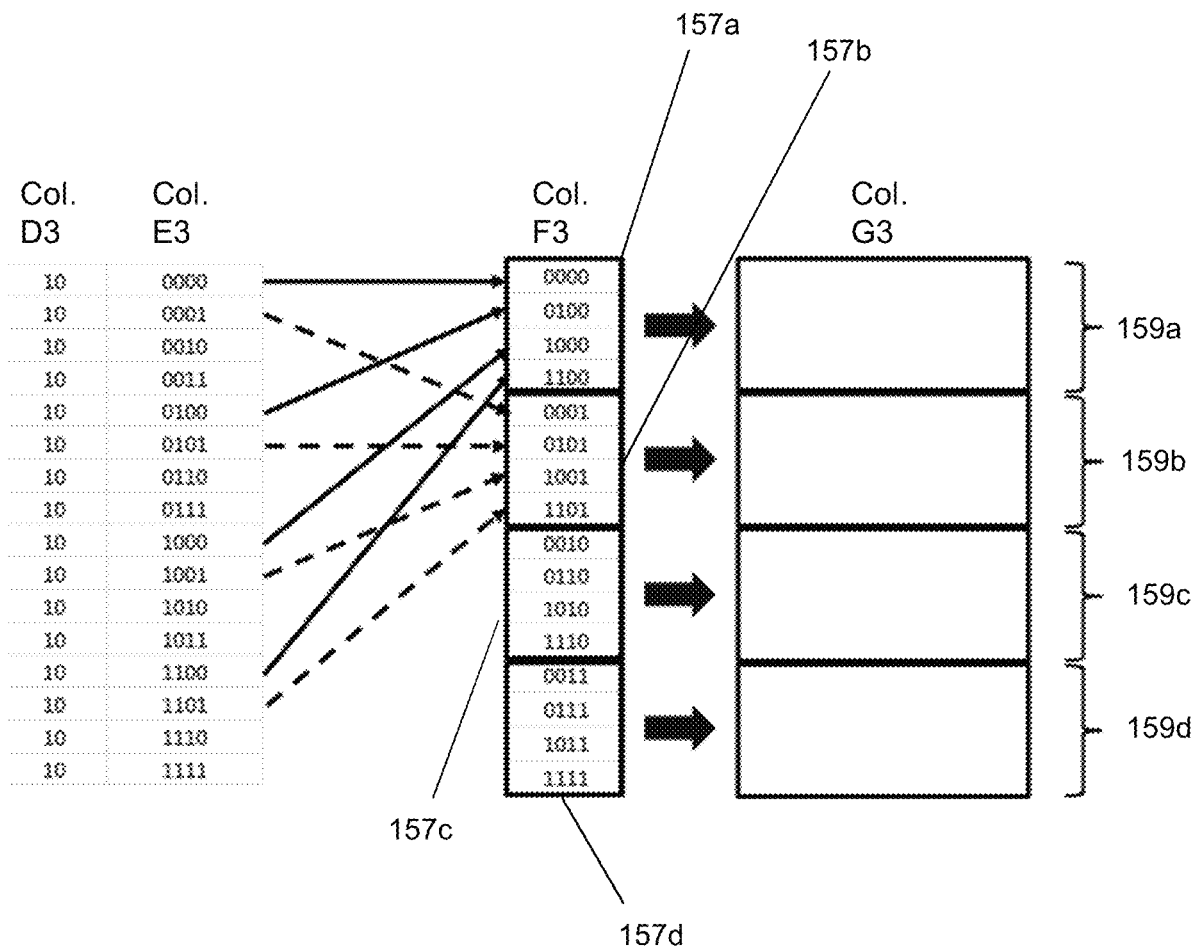

Similarly, for the third starting residual bits combination [1 0] (Column D3, FIG. 16), the possible bit combinations for the second initial segment 137b (Column E3) are re-arranged in four groups of four 157a, 157b, 157c, 157d (Column F3) and then corresponding look-up tables 159a, 159b, 159c, 159d (Column G3) are constructed by applying the coder model to each of the possible bit combinations (Column F3).

Figure 17:
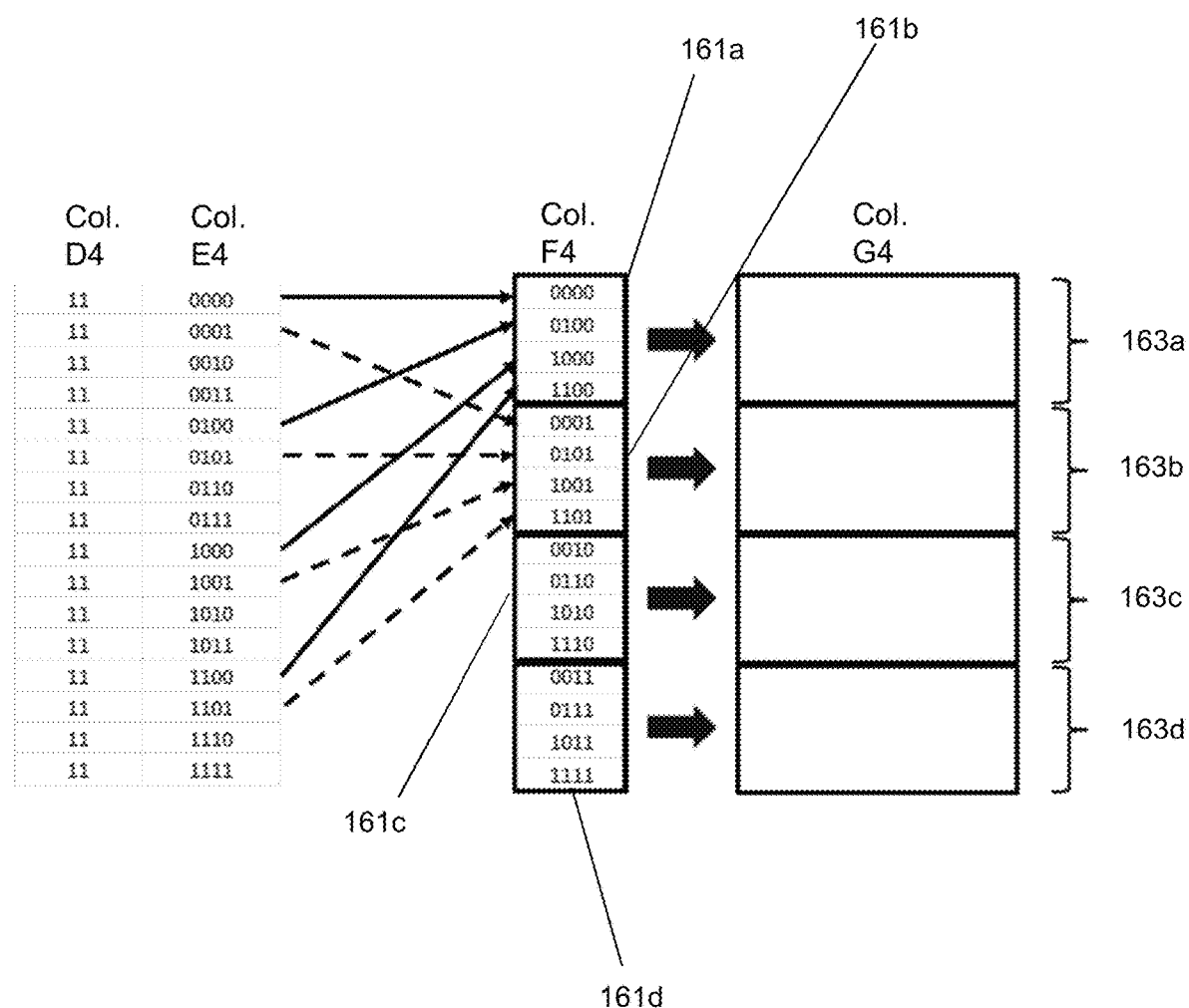

Similarly, for the fourth starting residual bits combination [1 1] (Column D4, FIG. 17), the possible bit combinations for the second initial segment 137b (Column E4) are re-arranged in four groups of four 161a, 161b, 161c, 161d (Column F4) and then corresponding look-up tables 163a, 163b, 163c, 163d (Column G4) are constructed by applying the coder model to each of the possible bit combinations (Column F4).

Figure 18:
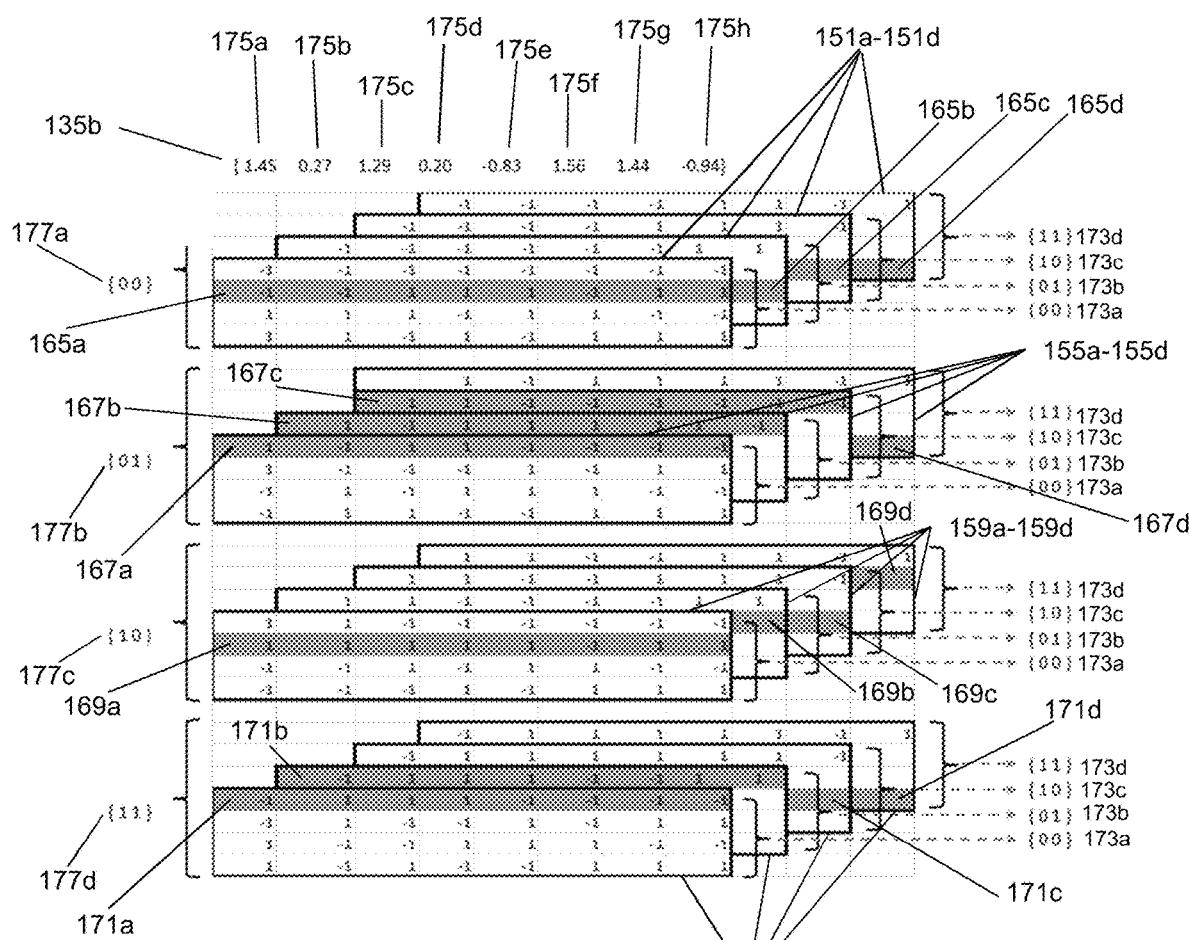
FIG. 18 shows the look-up tables for the second received segment.

Thus in total, 16 look-up tables 151a-151d, 155a-155d, 159a-159d, 163a-163d are provided for the second initial segment 137b, four for each "starting residual bits" combination. In each look-up table for the second initial segment 137b, there are four possible output sequences, each having eight values (wherein each value is 1 or −1). Once the look-up tables for the second initial segment 137b have been constructed, the second received segment 135b (which contains eight received data values 175a-175h) may be decoded (FIG. 18).

To decode the second received segment 135b, the second received segment 135b is compared against the four possible output sequences in each look-up table to obtain a closest match 165a-165d, 167a-167d, 169a-169d, 171a-171d for each respective look-up table.

The 16 estimated encoded sequences representing the closest matches for each look-up table are stored for later use, together with the corresponding second initial segment bit combinations (taken from Columns F1-F4), the "starting residual bits" (177a-177d taken from Columns D1-D4) and the associated "final residual bits" (173a-173d taken from Columns F1-F4).

The third 135c and fourth 135d received segments are decoded in the same way as the second received segment 135b.

In the example embodiment of the invention, after decoding, there are four datasets stored for the first received segment 135a and 16 datasets stored for each of the second 135b, third 135c and fourth 135d received segments.

In an alternative embodiment, an artificial neural network implementation may involve using the neural network in place of the sequential decoding method using generated look-up tables. In such an embodiment, the artificial neural network would be trained to provide the estimated encoded data sequences directly from the received segments.

Step 3—Decoded Segment Merging

Once all received segments have been decoded, the datasets are retrieved from the memory 9 and the estimated encoded sequences are merged, two at a time.

Figure 19:
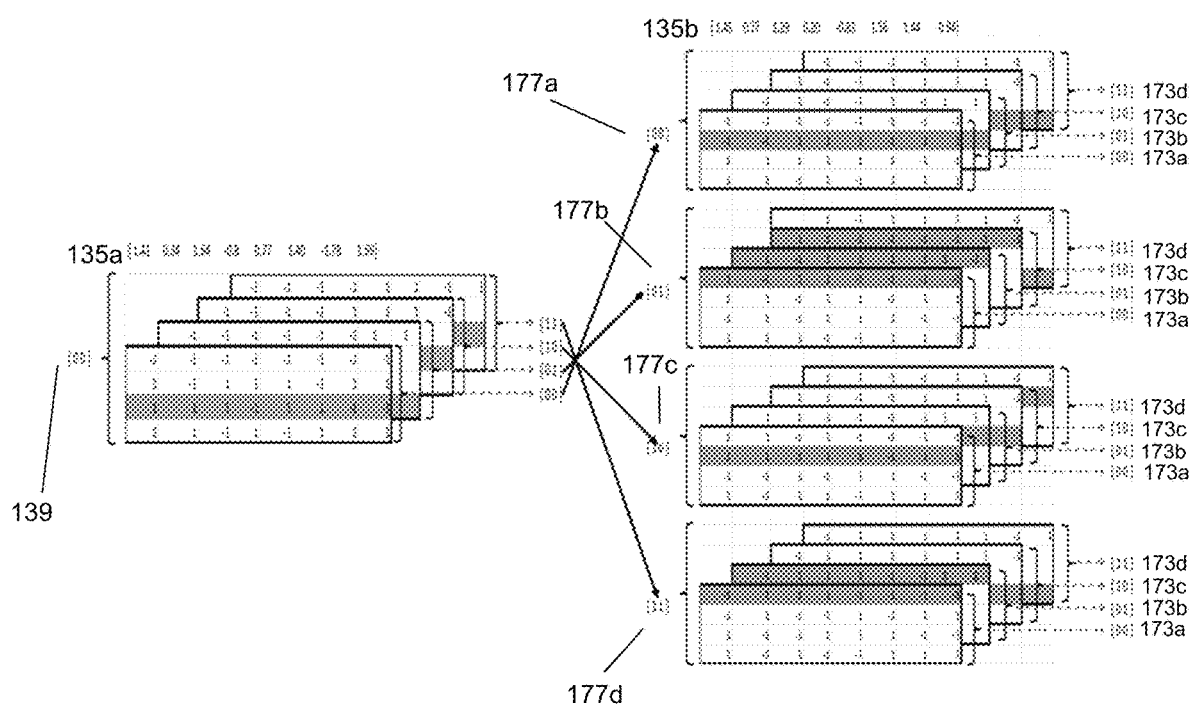
FIG. 19 is a flow diagram showing the merging of decoded first and second segments.
Figure 20:
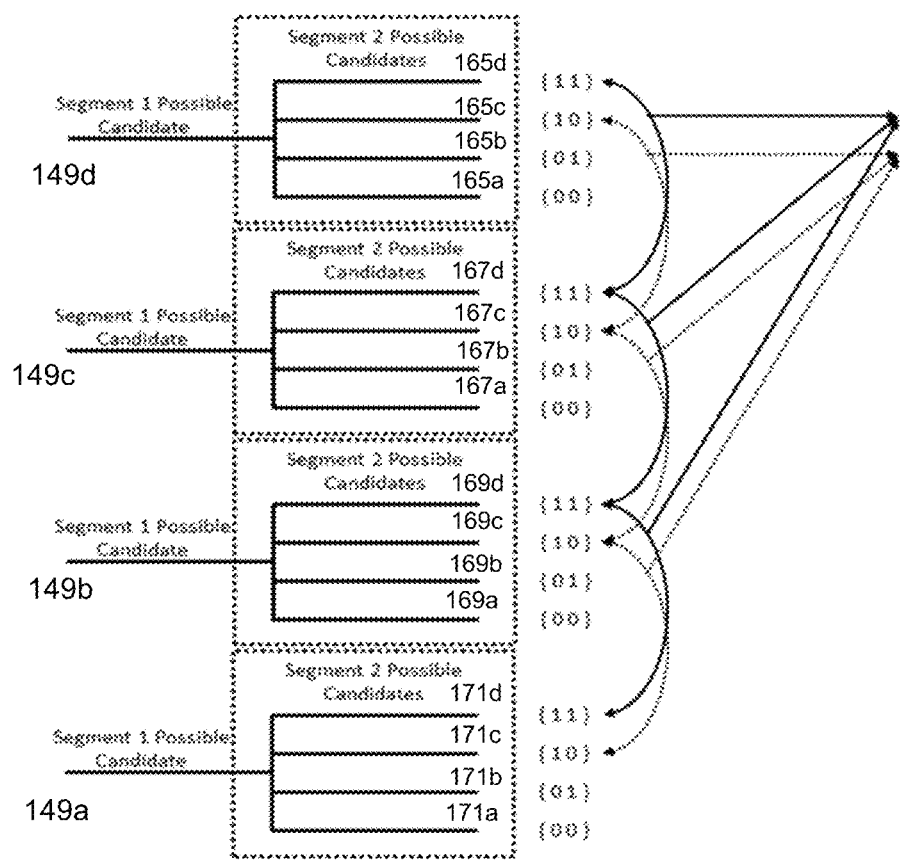
FIG. 20 is a flow diagram showing selection of the merged segments of FIG. 19, to be merged with the third decoded segment.

The first merge is between the estimated encoded sequences for the first 137a and second 137b initial segments. When merging, the "final residual bits" 143a-143d associated with the estimated encoded sequences 149a-149d for the first initial segment 137a, are matched with the "starting residual bits" (177a-177d taken from Columns D1-D4) of the estimated encoded sequences for the second initial segment 137b (FIG. 19). Then, each pair of matched estimated encoded sequences is combined into a single sequence. The combined sequences are grouped according to the corresponding "final residual bits" 173a-173d of the estimated encoded sequences for the second initial segment 137b, to provide four groups of four merged sequences (FIG. 20). A closest match is then obtained by comparing the combined sequences in each group with the actual combined first and second received segments. Thus, four best-fit sequences each having 16 data values are obtained.

The second merge is between the four best-fit sequences just obtained, and the estimated encoded sequences for the third initial segment 137c. When merging, the "final residual bits" associated with the best-fit sequences (which correspond to the "final residual bits" associated with the estimated encoded sequences of the second initial segment 173a-173d), are matched with the "starting residual bits" (not shown) of the estimated encoded sequences (not shown) for the third initial segment 137c.

Then, each pair of matched best-fit and estimated encoded sequences is combined into a single sequence. The combined sequences are grouped according to the corresponding "final residual bits" of the estimated encoded sequences for the third initial segment 137c, to provide four groups of four combined sequences. A closest match is then obtained by comparing the combined sequences in each group with the actual combined first, second and third received segments. Thus, four best-fit sequences each having 24 data values are obtained.

In a similar way, a final merge is undertaken with the estimated encoded sequences for the fourth initial segment, to provide four candidate sequences each having 32 values.

Step 4—Final Decoding

A final decoding step involves comparing each of the final 32-value candidate sequences with the entire received, encoded, data block, and selecting the closest fit. The selected closest fit sequence represents the encoded sequence most likely to have been output by the coder 101. The selected closest fit sequence can then be used to reverse calculate the initial data block using the known correspondence between the estimated encoded sequences merged into the selected candidate sequence, and the initial segment bits.

In the example embodiment of the invention, steps one to four of the method are performed using an artificial neural network with a suitable architecture, for example an adaptive neural network based on the Multi Layer Perceptron architecture which uses forward propagation to generate outputs that are then refined using back propagation through the network. Back propagation would typically involve a Stochastic Gradient Descent process, followed by an Adams optimization process.

Such an artificial neural network is known in the prior art. In a first stage, the artificial neural network is trained. During training, the artificial neural network is supplied with noisy received sequences and correctly decoded sequences. The neural network approximates the estimated encoded sequences for each initial segment, and compares the approximated sequences against the actual estimated encoded sequences for each initial segment calculated by the processor 7 using the above methodology. It does this by updating neuron weights based on a comparison metric designed to minimize the difference between the approximated sequences and the actual estimated encoded sequences.

After training, the above-described method is performed using the artificial neural network, by inputting to the artificial neural network (i) the received encoded data block; (ii) the convolutional coder model; and (iii) the number of segments required. Use of an artificial neural network advantageously provides increased decoding speed.

Use of an artificial neural network also advantageously provides increased adaptability. For example, when the radio is a software-defined radio, the radio may be easily adapted to process different encoded waveforms simply by updating the weights of the neural network.

In an alternative embodiment of the invention, the steps of the method are undertaken by the processing capabilities of the decoder, and not using a neural network.

While the present invention has been described and illustrated with reference to a particular embodiment, it will be appreciated by those of ordinary skill in the art that the invention lends itself to many different variations not specifically illustrated herein. By way of example only, certain possible variations will now be described.

In one such variation, there are two flip-flops in the shift register. The first tap-off point of the upper summation arm is then the input to the second flip-flop, the second tap-off point of the upper summation arm is the output from the second flip-flop and the third tap-off point of the upper summation arm is the output from the third flip-flop. Such a configuration might be implemented if there are constraints on logic.

In another such variation, alternative forms of hardware are used. For example, field-programmable gate arrays may be used in place of flip-flops. In another such variation, the coding may be undertaken in software.

In another such variation, there may be a significantly higher number of received segments, for example one hundred or one thousand segments.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method of decoding convolutionally encoded telecommunications data, the method comprising the following steps:
receiving a convolutionally encoded data block having a plurality of values;
dividing the received convolutionally encoded data block into a plurality of received segments, each received segment comprising at least two of the values;

decoding each received segment by providing, for each received segment, a plurality of estimated encoded sequences, each estimated encoded sequence comprising at least two data units;

merging estimated encoded sequences for consecutive segments to provide a plurality of candidate sequences; and, selecting one of the plurality of candidate sequences by performing a closest fit calculation between the received encoded data block and each of the candidate sequences, wherein the step of providing a plurality of estimated encoded data sequences comprises:

providing, for each received segment, a plurality of estimated input sequence segments, each estimated input sequence segment comprising at least two data units, and calculating the plurality of estimated encoded data sequences by applying a coding model to the plurality of estimated input sequence segments;

wherein the merging comprises:

for each estimated encoded data sequence:

identifying an initial residual data unit combination representing the data units that would be residual in a coder memory when the first data unit of the corresponding estimated input sequence segment enters the coder, and identifying a final residual bit combination representing the data units that would be residual in the coder memory when the first data unit of the subsequent estimated input sequence segment enters the coder, and matching the final residual bit combinations corresponding to the estimated encoded data sequences for one received segment, to the initial residual bit combinations corresponding to the estimated encoded data sequences for the subsequent received segment.

2. The method according to claim 1 wherein decoding each received segment comprises decoding each received segment in parallel.

3. The method according to claim 1 wherein decoding each received segment comprises decoding each received segment in series.

4. The method according to claim 1 wherein providing, for each received segment, a plurality of estimated encoded sequences, comprises for each received segment, performing a closest fit calculation.

5. The method according to claim 1 wherein merging comprises for each received segment in turn:

merging estimated encoded sequences for the received segment with estimated encoded data sequences for a consecutive received segment to provide a plurality of merged sequences, and then performing a closest fit calculation between the merged sequences and the corresponding received segments combined, and then merging the merged sequences with estimated encoded sequences for a further subsequent received segment, until a plurality of candidate sequences is provided, each having a length equal to a length of the received encoded data block.

6. A method according to claim 1 wherein at least some of the steps of the method are performed using an artificial neural network.

7. A method according to claim 1 further comprising the steps of:

encoding a data block having a plurality of bits, using a convolutional coder to provide the convolutionally encoded data block;

transmitting the convolutionally encoded data block.

8. A non-transitory computer readable media storing instructions configured to execute the steps of the method according to claim 1.

9. A software-defined radio comprising:

an antenna;

an analogue to digital converter;

a processor;

a memory; and, the non-transitory computer readable media of claim 8, wherein the processor is configured to run the executable instructions from the non-transitory computer readable media.

* * * * *